(12) United States Patent
Singh et al.

(10) Patent No.: US 7,158,896 B1
(45) Date of Patent: Jan. 2, 2007

(54) REAL TIME IMMERSION MEDIUM CONTROL USING SCATTEROMETRY

(75) Inventors: Bhanwar Singh, Morgan Hill, CA (US); Srikanteswara Dakshina-Murthy, Wappingers Falls, NY (US); Khoi A. Phan, San Jose, CA (US); Ramkumar Subramanian, Sunnyvale, CA (US); Bharath Rangarajan, Sunnyvale, CA (US); Iraj Emami, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 138 days.

(21) Appl. No.: 10/978,604

(22) Filed: Nov. 1, 2004

(51) Int. Cl.
*G06F 19/00* (2006.01)

(52) U.S. Cl. .................. 702/31; 700/120; 700/121; 438/5; 438/7; 438/14; 438/16

(58) Field of Classification Search .................. None
See application file for complete search history.

(56) References Cited

U.S. PATENT DOCUMENTS

| | | | |
|---|---|---|---|
| 6,781,670 B1 * | 8/2004 | Krautschik .................. 355/53 |
| 6,844,206 B1 * | 1/2005 | Phan et al. .................. 438/7 |
| 6,999,254 B1 * | 2/2006 | Phan et al. .................. 359/896 |
| 7,006,209 B1 * | 2/2006 | Levinson .................. 356/128 |
| 7,014,966 B1 * | 3/2006 | Pawloski et al. .................. 430/30 |
| 2004/0084794 A1 * | 5/2004 | Frey .................. 264/40.5 |
| 2005/0018208 A1 * | 1/2005 | Levinson .................. 356/517 |
| 2005/0046813 A1 * | 3/2005 | Streefkerk et al. .................. 355/30 |
| 2005/0073671 A1 * | 4/2005 | Borodovsky .................. 355/77 |
| 2005/0132914 A1 * | 6/2005 | Mulkens et al. .................. 101/463.1 |
| 2005/0175776 A1 * | 8/2005 | Streefkerk et al. .................. 427/256 |
| 2005/0219482 A1 * | 10/2005 | Baselmans et al. .................. 355/30 |
| 2005/0219483 A1 * | 10/2005 | Baselmans et al. .................. 355/30 |
| 2005/0243292 A1 * | 11/2005 | Baselmans et al. .................. 355/53 |
| 2006/0082748 A1 * | 4/2006 | Schmidt et al. .................. 355/53 |

* cited by examiner

*Primary Examiner*—Patrick J. Assouad
(74) *Attorney, Agent, or Firm*—Amin, Turocy, & Calvin, LLP

(57) ABSTRACT

Systems and/or methods are disclosed for measuring and/or controlling an amount of impurity that is dissolved within an immersion medium employed with immersion lithography. The impurity can be photoresist from a photoresist layer coated upon a substrate surface. A known grating structure is built upon the substrate. A real time immersion medium monitoring component facilitates measuring and/or controlling the amount of impurities dissolved within the immersion medium by utilizing light scattered from the known grating structure.

25 Claims, 16 Drawing Sheets

Fig. 9
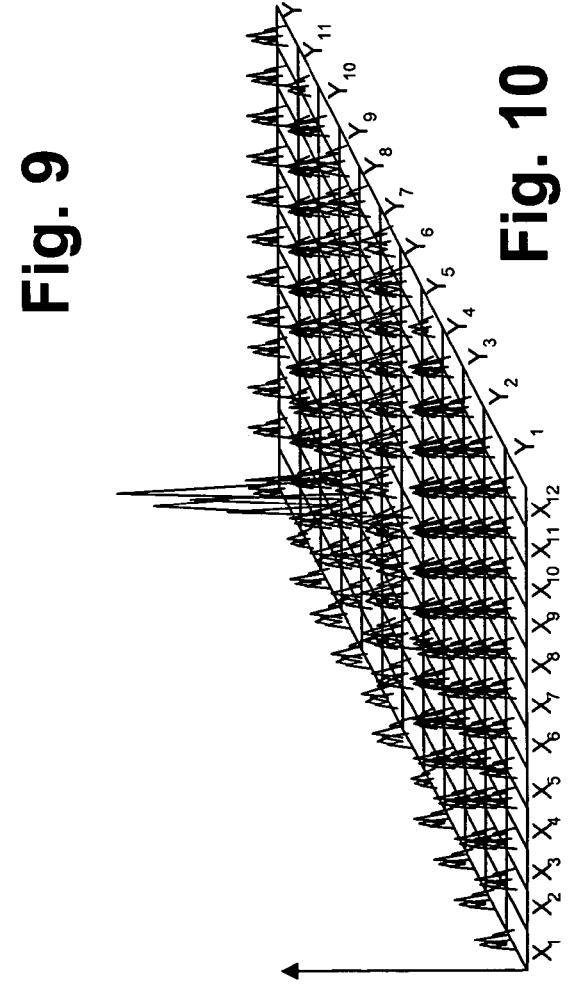
Fig. 10
Fig. 11

REAL TIME IMMERSION MEDIUM CONTROL USING SCATTEROMETRY

TECHNICAL FIELD

The present invention generally relates to semiconductor processing and, more particularly, to systems and methods for real time monitoring and/or controlling of characteristics of an immersion medium utilized in connection with immersion lithography that employs scatterometry techniques.

BACKGROUND OF THE INVENTION

In the semiconductor industry, there is a continuing trend toward higher device densities. To achieve these higher device densities there have been, and continue to be, efforts toward scaling down device dimensions (e.g., at sub-micron levels) on semiconductor wafers. In order to accomplish such densities, smaller feature sizes and more precise feature shapes are required. This can include width and spacing of interconnecting lines, spacing and diameter of contact holes, and surface geometry, such as corners and edges, of various features. The dimensions of and between such small features can be referred to as critical dimensions (CDs). Reducing CDs and reproducing more accurate CDs facilitates achieving higher device densities.

High resolution lithographic processes can be used to achieve small features. In general, lithography refers to processes for pattern transfer between various media. In lithography for integrated circuit fabrication, a silicon slice, the wafer, is coated uniformly with a radiation-sensitive film, the photoresist. The film is selectively exposed with radiation (e.g., optical light, x-ray, electron beam, . . . ) through an intervening master template (e.g., mask, reticle, . . . ) forming a particular pattern (e.g., patterned resist). Dependent upon coating type, exposed areas of the coating become either more or less soluble than unexposed areas in a particular solvent developer. More soluble areas are removed with the developer in a developing step, while less soluble areas remain on the silicon wafer to form a patterned coating. The pattern corresponds to either the image of the mask or its negative. The patterned resist is used in further processing of the silicon wafer.

Efforts to reduce CDs have included implementing various techniques in connection with the lithographic process, such as reducing exposure radiation wavelength (e.g., from 436 nm mercury g-line to 365 nm i-line to 248 nm DUV to 193 nm excimer laser), improving optical design, utilizing metrology techniques (e.g., scatterometry, scanning electron microscope (SEM)), etc. Immersion lithography is another technique that facilitates further reduction of CDs.

In immersion lithography, the gap between a substrate (e.g., wafer) and a final optical component (e.g., lens, scanner) is filled with an immersion medium, which has a refractive index greater than the refractive index of air. Refractive index is defined as a ratio of speed of light in a vacuum to speed of light in a particular medium. Utilizing an immersion medium with a refractive index greater than that of air, which approximately equals 1, can increase numerical aperture, which is defined as a lens's ability to gather diffracted light and resolve fine details onto a wafer. Furthermore, utilization of an immersion medium can decrease an effective wavelength of an exposure radiation propagating within the immersion medium without changing exposure radiation, lasers, lens materials, etc.

A photoresist material, which typically is coated on the substrate, can interact with and dissolve into the immersion medium, which can change optical properties of the immersion medium (e.g., refractive index, lithographic constant). Additionally, dissolution of trace amounts of photoresist material into the immersion medium can impact efficiency of immersion lithography systems and can elevate costs associated with expensive immersion mediums. Thus, there exists a need for systems and methods that improve immersion lithography.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is merely to present some concepts of the invention in a simplified form as a prelude to the more detailed description that is presented later.

The present invention provides systems and methods for measuring and/or controlling an amount of impurities dissolved within an immersion medium. The impurities can be, for example, photoresist from a photoresist layer that covers a substrate. Additionally, a known grating structure can be constructed upon the substrate. In accordance with the present invention, the immersion medium occupies a gap between a final optical component (e.g., lens) and the substrate (e.g., wafer, wafer stage, reticle, . . . ), and typically has a refractive index greater than 1. According to another aspect of the present invention, the immersion medium can be around 100% transparent to an exposure wavelength. Additionally, the immersion medium can be water, supercritical fluid in gaseous phase, ozone vapor, etc.

According to an aspect of the present invention, a system that monitors characteristics of an immersion medium to facilitate controlling semiconductor manufacturing emits a signal into the immersion medium. The signal interacts with the immersion medium, substrate, known grating structure, and/or impurities to produce a reflected and/or diffracted signal(s). The reflected and/or diffracted signal is received by the system and analyzed to determine an amount of impurities in the immersion medium. For example, the amount of impurities can be determined by employing scatterometry. According to another aspect, the amount of impurities can be determined in real time. According to an additional aspect, a control component can reduce and/or eliminate the amount of impurities within the immersion medium by flushing the immersion medium, purifying the immersion medium, stopping semiconductor manufacturing, notifying a user, etc.

Another aspect of the present invention provides a method for measuring and/or controlling an amount of impurities dissolved within an immersion medium. A substrate with a known grating structure build upon it is at least partially immersed in an immersion medium. An incident signal is transmitted into the immersion medium and onto the substrate and/or known grating structure. The signal can be reflected and/or diffracted. The reflected and/or diffracted signal is received and analyzed to determine an amount of impurity within the immersion medium. The amount of impurities can be determined in real time. Additionally, characteristics of the immersion medium such as, for example, refractive index and lithographic constant, can be derived. Furthermore, the amount of impurities can be reduced and/or mitigated by flushing the immersion medium, purifying the immersion medium, stopping semiconductor manufacturing, notifying the user, etc.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

BRIEF DESCRIPTION OF THE DRAWINGS

FIG. 9 illustrates a perspective view of a grid-mapped wafer according to one or more aspects of the present invention.

FIG. 10 illustrates plots of measurements taken at grid-mapped locations on a wafer in accordance with one or more aspects of the present invention.

FIG. 11 illustrates a table containing entries corresponding to measurements taken at respective grid-mapped locations on a wafer in accordance with one or more aspects of the present invention.

DETAILED DESCIPTION OF THE INVENTION

Figure 1:
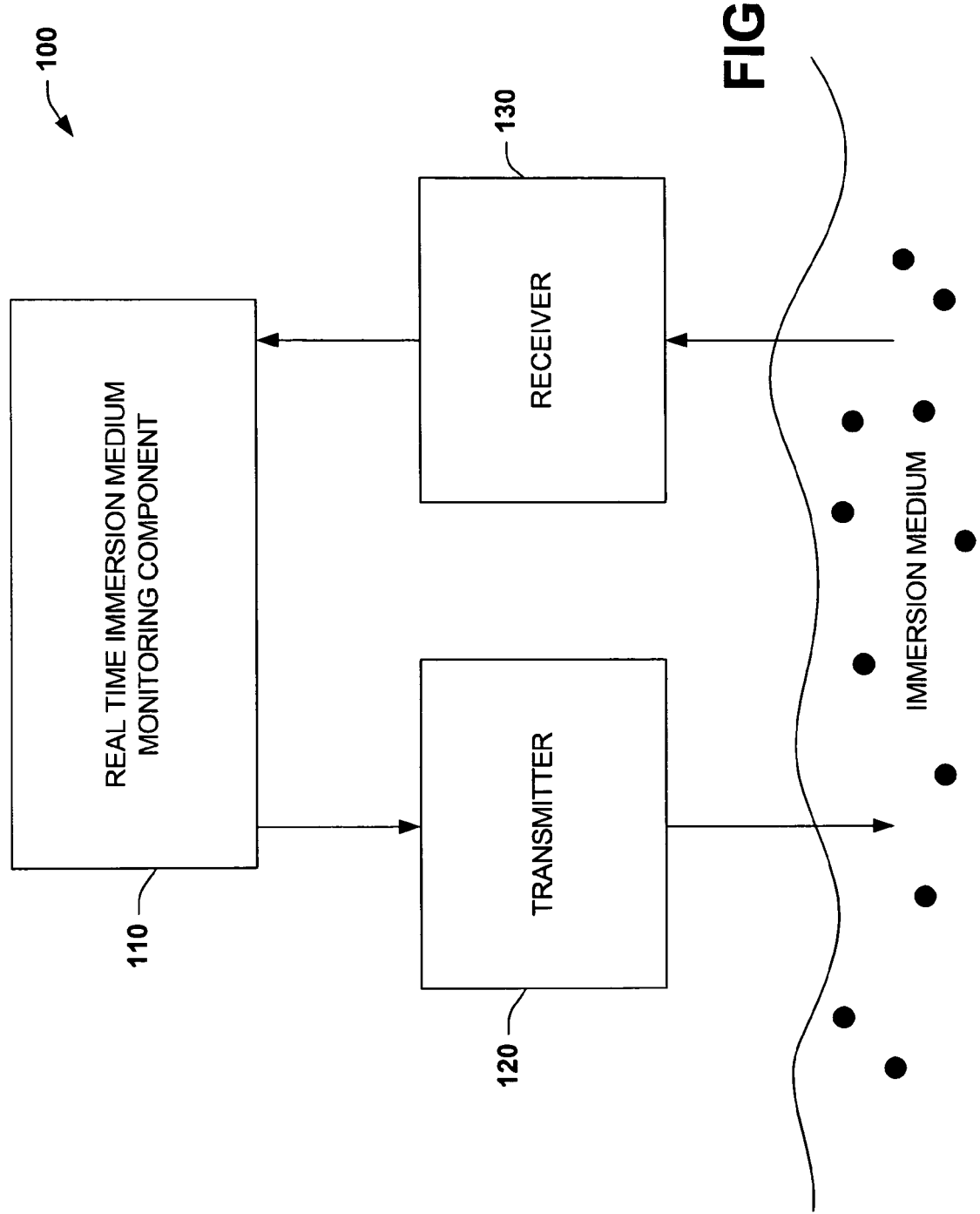
FIG. 1 is an illustration of a system for real time measuring and/or controlling characteristics of an immersion medium in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, to one skilled in the art that one or more aspects of the present invention may be practiced with a lesser degree of these specific details. In other instances, known structures and devices may be shown in block diagram form in order to facilitate describing one or more aspects of the present invention.

As used in this application, the term "component" is intended to refer to a computer-related entity, either hardware, a combination of hardware and software, software, or software in execution. For example, a component may be, but is not limited to being a process running on a processor, a processor, an object, an executable, a thread of execution, a program, a set of co-operating computers and/or processes and a computer.

It is to be appreciated that various aspects of the present invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, and function line networks) can be employed. The invention can employ various inference schemes and/or techniques in connection with state determination, inference and/or prediction. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

FIG. 1 illustrates a block diagram of a system 100 for measuring and/or controlling impurity dissolution in an immersion medium in accordance with one aspect of the present invention. The system 100 comprises a real time immersion medium monitoring component 110. The real time immersion medium monitoring component 110 is coupled to a transmitter 120 that emits a first signal into the immersion medium. The first signal interacts with (e.g., signal is reflected, diffracted, . . . ) the immersion medium and/or a substrate (e.g., wafer, wafer stage, reticle, . . . ) and/or a known grating structure built upon the substrate and/or a prism or mirror positioned upon the substrate. Additionally, a receiver 130 obtains a second signal (e.g., first signal which is reflected, diffracted, . . . ) from the immersion medium and provides the signal to the real time immersion medium monitoring component 110. The real time immersion medium monitoring component 110 analyzes the first signal and/or the second signal to determine an amount of impurity within the immersion medium. For example, the real time immersion medium monitoring component 110 can employ scatterometry to evaluate an amount of impurity dissolved within the immersion medium.

According to an aspect of the present invention, the immersion medium occupies a gap between a substrate and a final optical component (not shown) utilized in connection with photolithographic processing (e.g., a lens). Characteristics of the immersion medium can include low optical absorption at the exposure radiation wavelength, compatibility with resist and lens material, uniformity of properties throughout the immersion medium, non-contaminating, etc. According to an aspect of the present invention, the immersion medium can be, for example, water, oil (e.g., perfluorinated polyethers (PFPE) including PFPE-k, PFPE-Y, PFPE-D, PFPE-M, PFPE-Z), etc. The immersion medium utilized in connection with the present invention typically has a refractive index greater than a refractive index of air. For example, the refractive index corresponding to about 193 nm radiation is approximately 1.4 for water and approximately 1 for air. Furthermore, it is desirable to utilize an immersion medium that is about 100% transparent to an exposure radiation wavelength, although the present invention is not so limited. According to an aspect, a droplet, a plurality of droplets, or an amount that fills a container (not shown) of the immersion medium can be utilized in connection with the present invention.

A layer of photoresist material can be formed upon the substrate. The photoresist material is light sensitive such that exposure to light yields changes of the structure and properties of the photoresist. The present invention contemplates utilization of positive and/or negative photoresists. The photoresist layer can interact with the immersion medium and a portion of the photoresist material (e.g., trace amounts) can dissolve into the immersion medium. By way of example, dissolution of photoresist into the immersion medium can change the optical properties of the immersion medium; thus, the efficiency of the photolithographic system employing the immersion medium can be detrimentally impacted and the costs associated with the immersion medium can be increased by such dissolution of photoresist material.

The real time immersion medium monitoring component 110 can derive an amount of impurity (e.g., photoresist) dissolved within the immersion medium. The existence of dissolved impurity can be derived from light scattering of a known grating structure which can be built upon the substrate (e.g., wafer, wafer stage, reticle, . . . ). The substrate is at least partially immersed within the immersion medium and subjected to radiation by the transmitter 120, which is detected by the receiver 130 and analyzed by the real time immersion medium monitoring component 110 to yield a determination of the existence of trace amounts of dissolved impurities within the immersion medium. It is to be appreciated that the real time immersion medium monitoring component 110 can employ a scatterometry technique. However, the present invention contemplates any alternative suitable technique, and such are intended to fall within the scope of the heretoappended claims.

According to another aspect of the present invention, the real time immersion medium monitoring component 110 can monitor optical properties of the immersion medium, such as refractive index (n) and photolithographic constant (k), in real time. These optical properties of the immersion medium can be monitored by providing a signal into the immersion medium via the transmitter 120 and receiving a signal from the immersion medium via the receiver 130. The emitted and/or obtained signals can be employed by the real time immersion medium monitoring component 110 to determine the optical properties of the immersion medium.

Figure 2:
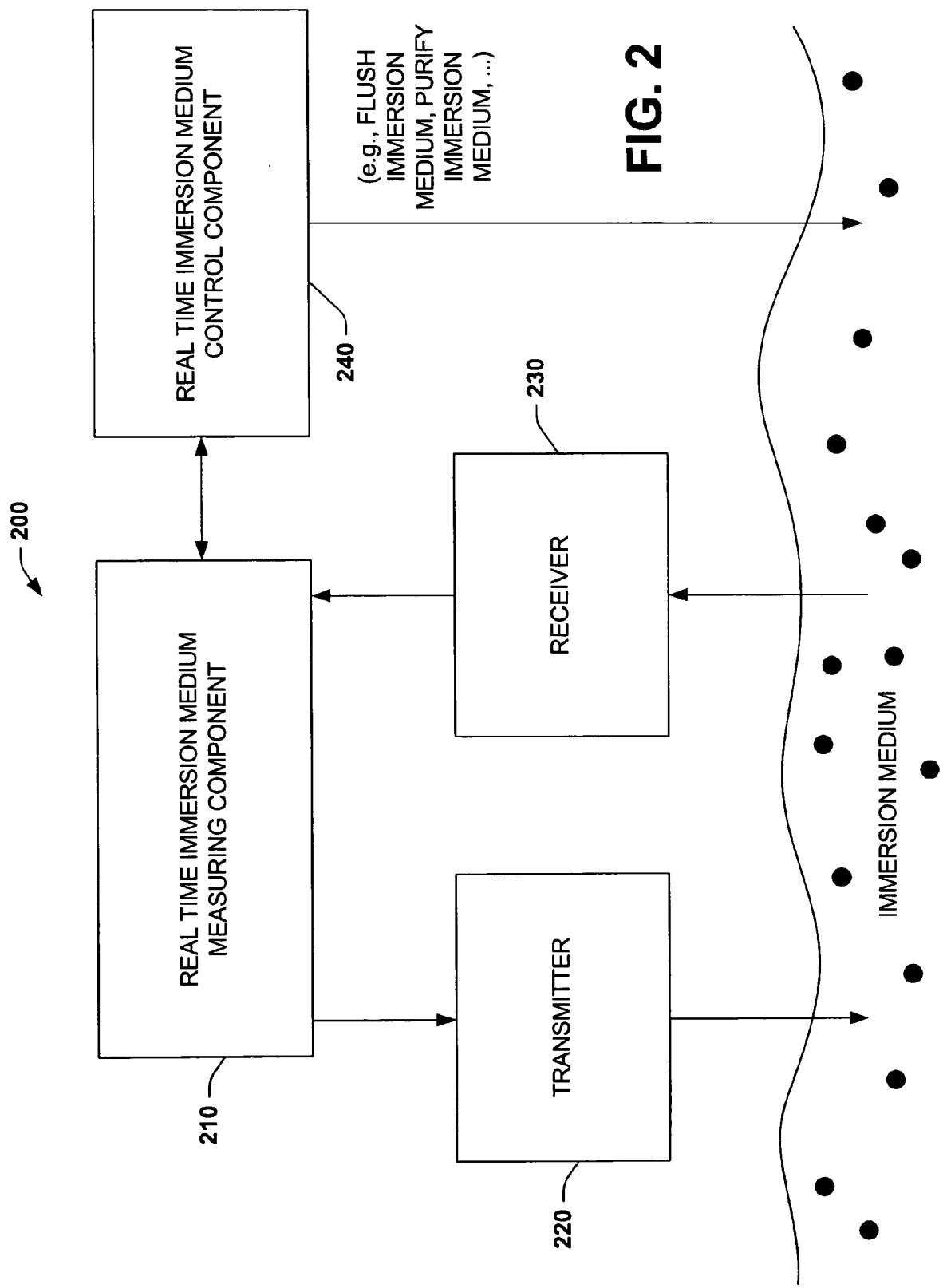
FIG. 2 is an illustration of another system for real time measuring and/or controlling characteristics of an immersion medium in accordance with an aspect of the present invention.

FIG. 2 illustrates another block diagram of a system 200 that measures and/or controls characteristics of an immersion medium in accordance with an aspect of the present invention. The system 200 comprises a real time immersion medium measuring component 210, which is coupled to a transmitter 220 and a receiver 230. The real time immersion medium measuring component 210 utilizes the transmitter 220 to emit a first signal into the immersion medium. Additionally, the receiver 230 obtains a second signal from the immersion medium, which is provided to the immersion medium measuring component 210.

The second signal can be, for example, a reflected and/or diffracted first signal. The first signal introduced into the immersion medium via the transmitter 220 can interact with a substrate (e.g., mask, wafer, . . . ), a known grating structure built upon the substrate, a prism positioned upon the substrate, a mirror located upon the substrate, and/or impurities within the immersion medium (e.g., dissolved photoresist material). The real time immersion medium measuring component 210 can determine an amount of impurities dissolved within the immersion medium. For example, the real time immersion medium measuring component 210 can employ a scatterometry technique to evaluate an amount of dissolved impurities. According to another aspect of the present invention, the real time immersion medium measuring component 210 can measure optical properties of the immersion medium, such as refractive index (n) and photolithographic constant (k), in real time.

The real time immersion medium measuring component 210 is coupled to a real time immersion medium control component 240, which controls the amount of impurity dissolved within the immersion medium. By way of example, the real time immersion medium measuring component 210 can determine that the amount of dissolved impurities within the immersion medium exceeds a threshold amount. Thus, the real time immersion medium measuring component 210 can employ the real time immersion medium control component 240 to facilitate reduction and/or elimination of impurities.

According to an aspect of the present invention, the real time immersion medium control component 240 can flush the immersion medium from the semiconductor manufacturing system and provide a second immersion medium. For example, if the immersion medium is water, the real time immersion medium control component 240 can remove the water containing an amount of impurity located between a final optical component (e.g., lens) and a substrate (e.g., wafer, wafer stage, reticle, . . . ) and provide water that is free of impurities or has a reduced amount of impurities. According to another example, the real time immersion medium control component 240 can employ essentially any known purification technique to reduce the amount of dissolved impurities within the immersion medium.

In another example, the real time immersion medium control component 240 can stop semiconductor manufacturing when the amount of dissolved impurities measured via the real time immersion medium measuring component 210 exceeds a threshold amount. Thus, a user could proceed to evaluate the impurity level and/or replace and/or purify the immersion medium. According to another aspect, the real time immersion medium control component 240 can provide a user with a notification that the amount of dissolved impurities within the immersion medium exceeds a threshold amount. The present invention contemplates the use of any type of user notification including, for example, visual, auditory, touch, etc.; however, the present invention is not so limited.

Figure 3:
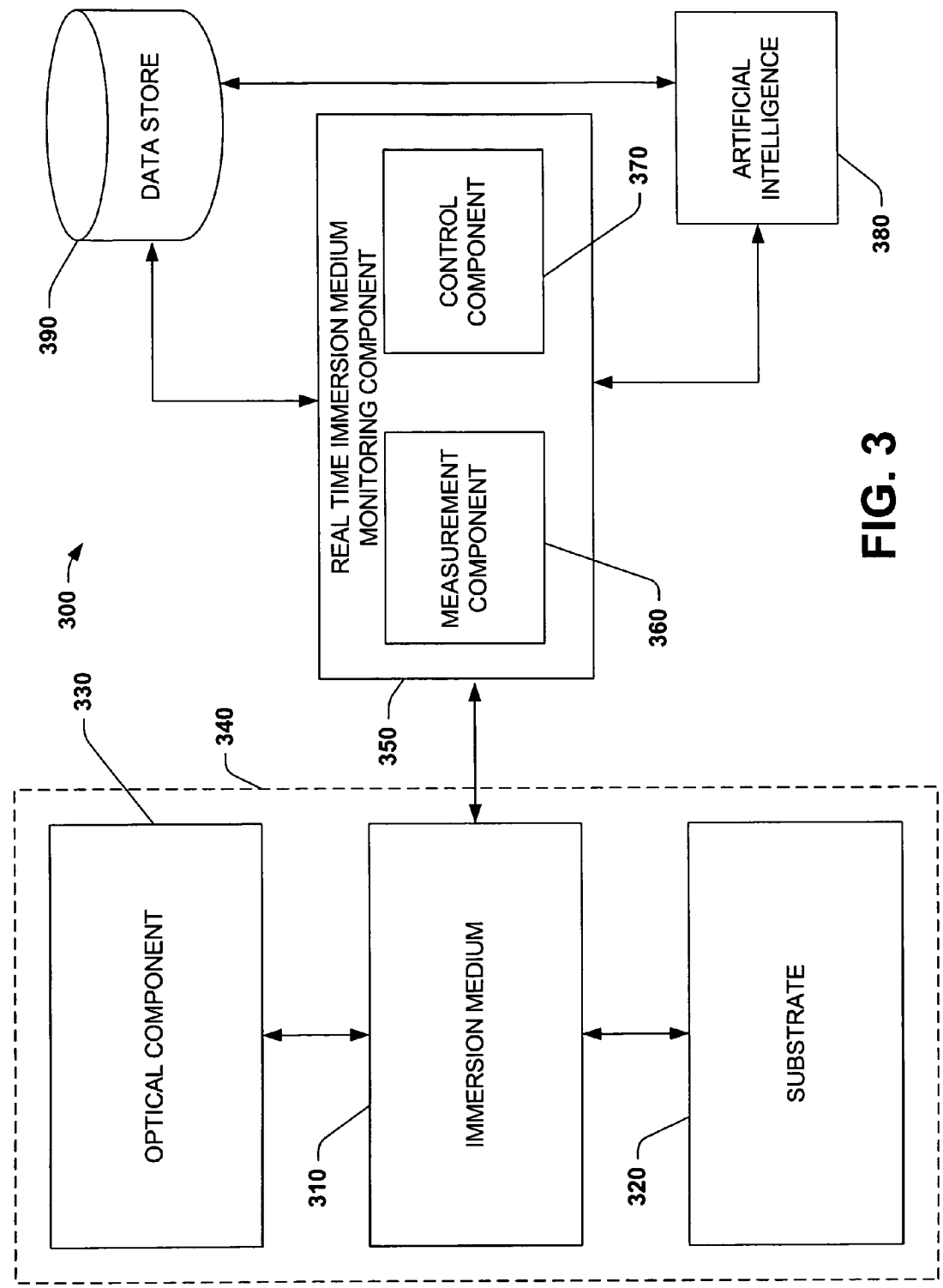
FIG. 3 is an illustration of a system for real time measuring and/or controlling characteristics of an immersion medium in accordance with an aspect of the present invention.

FIG. 3 illustrates an example of a system 300 for measuring and/or controlling an amount of impurities dissolved within an immersion medium 310 in accordance with an aspect of the present invention. The impurity measuring and/or controlling system 300 can employ various inference schemes and/or techniques in connection with measuring and controlling the amount of impurities (e.g., photoresist) dissolved within the immersion medium 310.

The dissolved impurity measuring and/or controlling system 300 comprises an immersion lithography system 340. The immersion lithography system 340 comprises the immersion medium 310 (e.g., water, oil, supercritical fluid in gaseous state, ozone vapor, . . . ), a substrate 320 (e.g., wafer, wafer stage, reticle, . . . ), and a optical component 330 (e.g., lens). The immersion medium 310 fills the gap between the substrate 320 and the optical component 330 such that at least part of the substrate 320 and at least part of the optical component are immersed within the immersion medium 310. The immersion medium 310 can be a droplet, a plurality of droplets, an amount of liquid that fills a container (not show), etc. Additionally, the immersion medium generally has a refractive index greater than 1, which facilitates lowering the effective wavelength of exposure radiation transmitted via the optical component 330.

A real time immersion medium monitoring component 350 is coupled to the immersion medium 310. The real time immersion medium monitoring component 360 comprises a measurement component 360 and a control component 370. The measurement component 360 determines an amount of impurities dissolved within the immersion medium 310. By way of example, the measurement component 360 can identify an amount of photoresist material from the surface of the substrate 320 that is dissolved in the immersion medium 310. The control component 370 can effectuate a change in the amount of dissolved impurities within the immersion medium 310. For example, the control component 370 can facilitate flushing the immersion medium 310 and providing a second amount of immersion medium lacking or substantially lacking the dissolved impurities, purifying the immersion medium 310, stopping a semiconductor fabrication process, notifying a user, etc.

The real time immersion medium monitoring component 350 is operatively coupled to an artificial intelligence (AI) component 380 that is capable of performing inferences regarding system operation, and a data store 390 that can store data corresponding to known grating structures on the substrate 320, prior immersion medium 310 characteristics, previous changes to the immersion medium 310 by means of the control component 370, etc. Additionally, the AI component 380 can be operatively coupled to the data store 390. By way of illustration, the AI component 380 can infer optimal changes to the immersion medium 310 effectuated via the control component 370. Furthermore, the AI component 380 and the real time immersion medium monitoring component 350 can store and retrieve data from the data store 390 corresponding to the immersion medium 310 such as, for example, impurity amounts, refractive index values, lithographic constant values, temperature, pressures, changes implemented to immersion medium 310, elapsed time since previous changes to the immersion medium 310, etc. These examples are given for illustration purposes and are not intended to limit the scope of the present invention or the number of, or manner in which the AI component 370 makes inferences.

Figure 4:
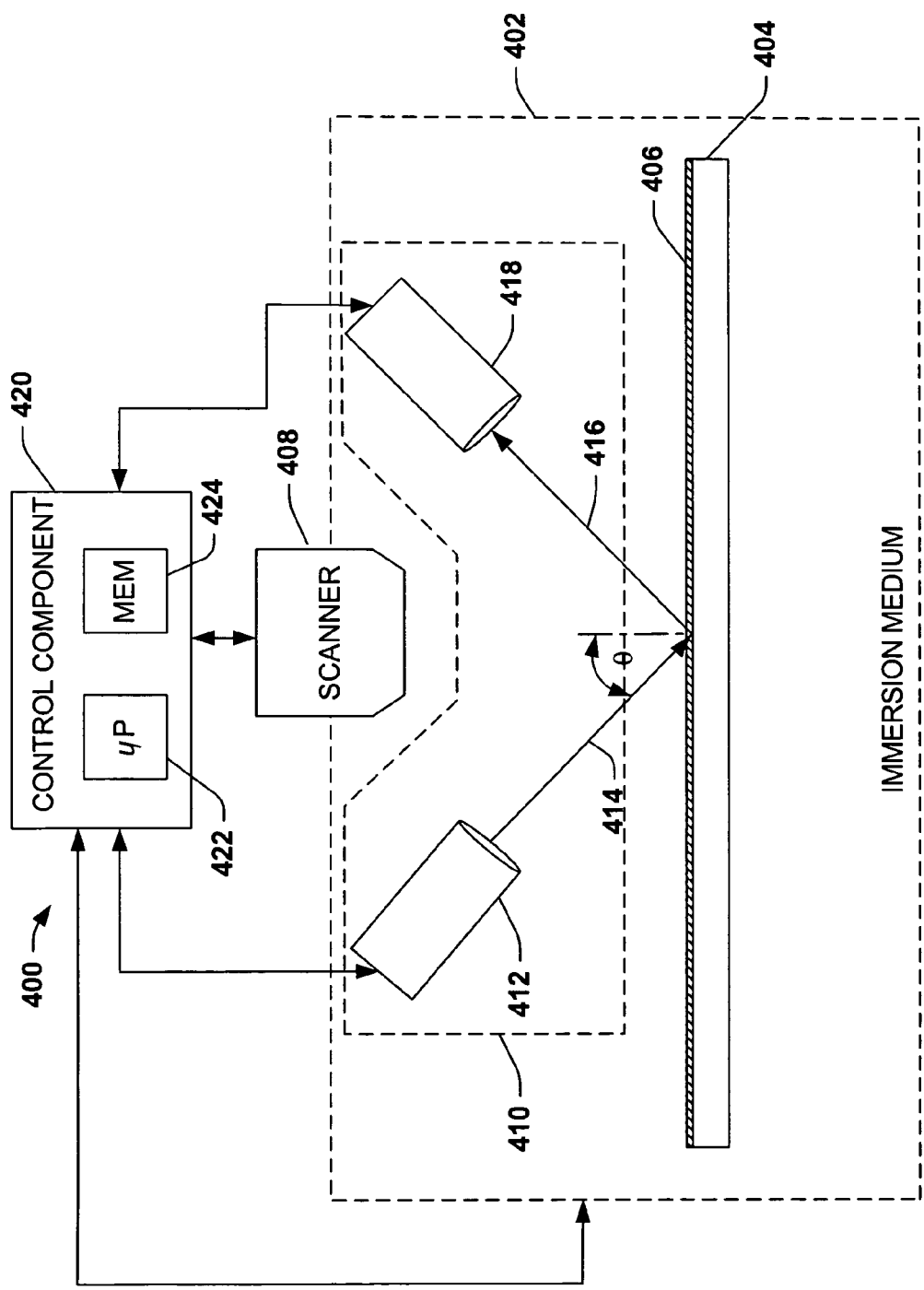
FIG. 4 is a schematic block diagram of an exemplary real time immersion medium characteristic monitoring system in accordance with an aspect of the present invention.

FIG. 4 illustrates an example of a system 400 that measures and/or controls characteristics of an immersion medium 402 in accordance with an aspect of the present invention. In this example, a substrate 404 (e.g., wafer, wafer stage, reticle, . . . ) with a known grating structure is at least partially within an immersion medium 402 (e.g., water, supercritical fluid in gaseous state, ozone vapor, . . . ). According to an aspect of the present invention, the immersion medium 402 can alternatively comprise a droplet or a plurality of droplets. The substrate 404 is at least partially coated with a layer of photoresist 406. Additionally, a final optical component, such as a lens 408, is also at least partially within the immersion medium 402. The system can also utilize a measuring system 410 for measuring features of the immersion medium 402 in accordance with an aspect of the present invention. For example, the measuring system 410 can monitor the immersion medium 402 in real time and identify dissolution of trace amounts of material from the photoresist layer 406. By way of illustration, the measuring system 410 is a non-destructive measurement tool that includes a source of light 412, such as one or more optical emitters, for emitting an incident light beam 414 toward the substrate 404 and photoresist layer 406 at an incident angle θ relative to a normal reference line. The light source 410 can be a frequency stabilized laser; however, it will be appreciated by one skilled in the art that any laser or other suitable light source (e.g., laser diode, or helium neon (HeNe) gas laser, halogen lamp, . . . ) can be utilized in connection with the present invention. Alternatively or additionally, the light source 410 can be a prism or a mirror located outside or inside of the immersion medium, which can provide the incident light beam 414.

At least a portion of the incident beam 414 is reflected and/or diffracted as a reflected beam 416. One or more optical detectors 418 receive(s) the reflected and/or diffracted beam 416. The detector(s) 418 analyze characteristics of the reflected beam 416 and can be operative to discern optical properties of the beam. As described below, the optical properties of the beam describe optical characteristics of the known grating structure built on the substrate 404 and the immersion medium 402, which facilitates deriving characteristics associated with the immersion medium 402. The immersion medium 402 characteristics, for example, can include refractive index and lithographic constant; additionally, an amount of photoresist material dissolved into the immersion medium 402 from the photoresist layer 406 impact the optical properties of the beam and can be determined.

By way of example, the detector 418 can include a spectrometer or any instrument capable of providing spectrally-resolved information concerning the reflected beam 416. The portion of the reflected beam 416 that enters the detector 418 for analysis is determined by such portion and its associated diffraction characteristics, the special extent of the reflected beam 416, properties of the detector 418, and any associated optical elements that might be used in conjunction with the detector 418.

The detector 418 collects light reflected and/or passed through one or more gratings and/or features built upon the substrate 404 and the immersion medium 402 and/or a prism or mirror positioned upon the substrate 404. Additionally, the light interacts with trace amounts of photoresist material from the photoresist layer 406 dissolved within the immersion medium 402. The measurement system 410 can extract information regarding the characteristics of the immersion medium 402 by comparing phase and/or intensity of the incident beam 414 with phase and/or intensity signals of a complex reflected and/or diffracted light associated with the reflected beam 416. The substrate 404 has a known grating structure constructed upon it, which allows for deriving characteristics of the immersion medium 402 such as the amount of dissolved photoresist. The intensity and/or the phase of the reflected and/or diffracted light changes based on properties of the immersion medium 402 such as the amount of dissolved photoresist material.

The system 400 can further comprise a control component 420. According to one aspect of the present invention, the control component 420 can be operatively coupled to the lens 408 (e.g., scanner), measurement system 410 and the immersion medium 402. The control component 420 can facilitate operation of the measurement system 410. Additionally, the control component 420 can effectuate changes of the immersion medium 402 such as altering temperature, pressure, flushing the immersion medium 402, etc. to mitigate trace amounts of dissolved impurities (e.g., photoresist) within the immersion medium 402 in real time and based at least in part upon measurements obtained by the measuring system 410. Additionally, according to another aspect of the present invention, such alterations associated with the immersion medium 402 can change refractive index and/or lithographic constant values based at least in part upon measurements obtained by the measuring system 410. Moreover, the control component 420 can further utilize such measurements to control operation of optical components such as, for example, the lens 408. Control of the lens 408 facilitates control over an exposure germane to a photolithographic process.

According to this aspect, a control component 420 further comprises a processor 422 and memory 424. It is to be understood that the processor 422 can be a processor dedicated to determining an amount of dissolved photoresist within the immersion medium 402, a processor used to control the immersion medium 402 thereby reducing an amount of dissolved photoresist material in the immersion medium, or, alternatively, a processor that is both used to determine an amount of dissolved photoresist within the immersion medium 402 and to control the amount of dissolved material in real time.

The memory 424 stores program code executed by the processor 422 for carrying out operating functions of the system. The memory 424 also serves as a storage medium for temporarily storing information, such as amount of dissolved impurities (e.g., photoresist), refractive index, lithographic constant, temperature, pressure, etc. that can be employed in carrying out the present invention. The memory 424 can be either volatile memory or nonvolatile memory, or can comprise both volatile and nonvolatile memory. By way of illustration, and not limitation, nonvolatile memory can comprise read only memory (ROM), programmable ROM (PROM), electrically programmable ROM (EPROM), electrically erasable programmable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory of the present systems and methods is intended to comprise, without being limited to, these and any other suitable types of memory.

Figure 5:
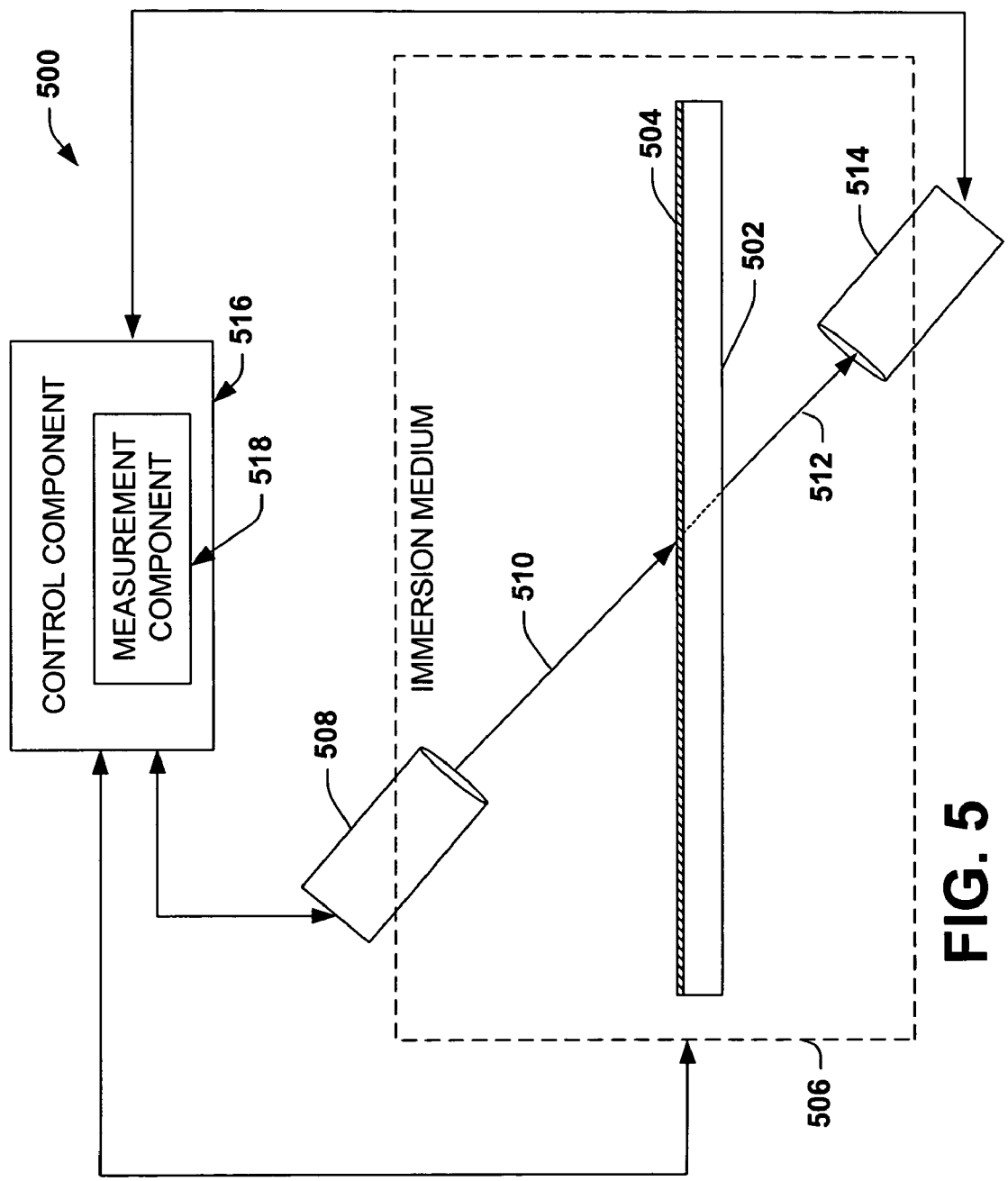
FIG. 5 is a schematic block diagram of another exemplary real time immersion medium characteristic monitoring system in accordance with an aspect of the present invention.

FIG. 5 illustrates an arrangement that is similar in function to FIG. 4, and which accommodates substrates that are partially or fully transparent. A photoresist layer 504 is positioned upon a substrate 502. The substrate 502 and photoresist layer 504 are at least partially within an immersion medium 506. The immersion medium 506 can comprise a droplet, a plurality of droplets or any amount of liquid. In this example, a light source 508 provides an incident beam 510, at least a portion of which is transmitted through the substrate 502, photoresist layer 504 and immersion medium 506. A diffracted and/or refracted beam 512 exits a side of the substrate 502 opposite to that of the incident beam 510. At least a portion of the diffracted beam enters a detector 514, such as a spectrometer, which can be processed using known scatterometry techniques as described herein.

By way of example, a control component 516, which is operatively coupled to the light source 508, the detector 514, and the immersion medium 506, is programmed and/or configured to control operation and/or characteristics of such components. In particular, the control component 516 includes a measurement component 518 programmed and/or configured to control operation of the light source 508 and the detector 514. As indicated below, the measurement component 518 also is programmed to determine characteristics of the immersion medium 506 based on optical data obtained by the detector 514 (e.g., spectrometer) based on the beam 512 and a known grating structure upon the substrate 502. For example, the measurement component 518 can be utilized to obtain refractive index and/or lithographic constant values of the immersion medium 506. Moreover, the measurement component 518 can be employed to monitor any trace amount of impurities dissolved within the immersion medium 506. The impurities can be, for example, a trace amount of photoresist material from the photoresist layer 504.

The control component 516 also is programmed and/or configured to control characteristics of the immersion medium 506. The control component 516 can control the amount of dissolved impurities within the immersion medium 506. For example, the control component 516 can flush the immersion medium 506 when the impurity level reaches a threshold amount. According to another aspect of the present invention, the control component 516 can purify the immersion medium 506 when trace amounts of impurities dissolve in the immersion medium 506. Additionally, the semiconductor fabricating process can be stopped and/or a user can be notified via the control component 516 when the amount of impurities dissolved in the immersion medium 506 reaches a threshold amount.

Additionally, the control component 516 can control temperature, pressure, exchange immersion medium, etc. to effectuate a change in characteristics of the immersion medium 506. Such characteristic changes can include, for example, varying refractive index, lithographic constant, etc. Alternatively or additionally, the control component 516 can control characteristics of the immersion medium 506 based at least in part on measured characteristics of the immersion medium 506 obtained via the measurement component 518. In this way, operation of the measuring component 518 and the immersion medium 506 can be synchronized to facilitate tunable refractive index and lithographic constant values of the immersion medium 506, which thus accommodate increased resolution.

Figure 6:
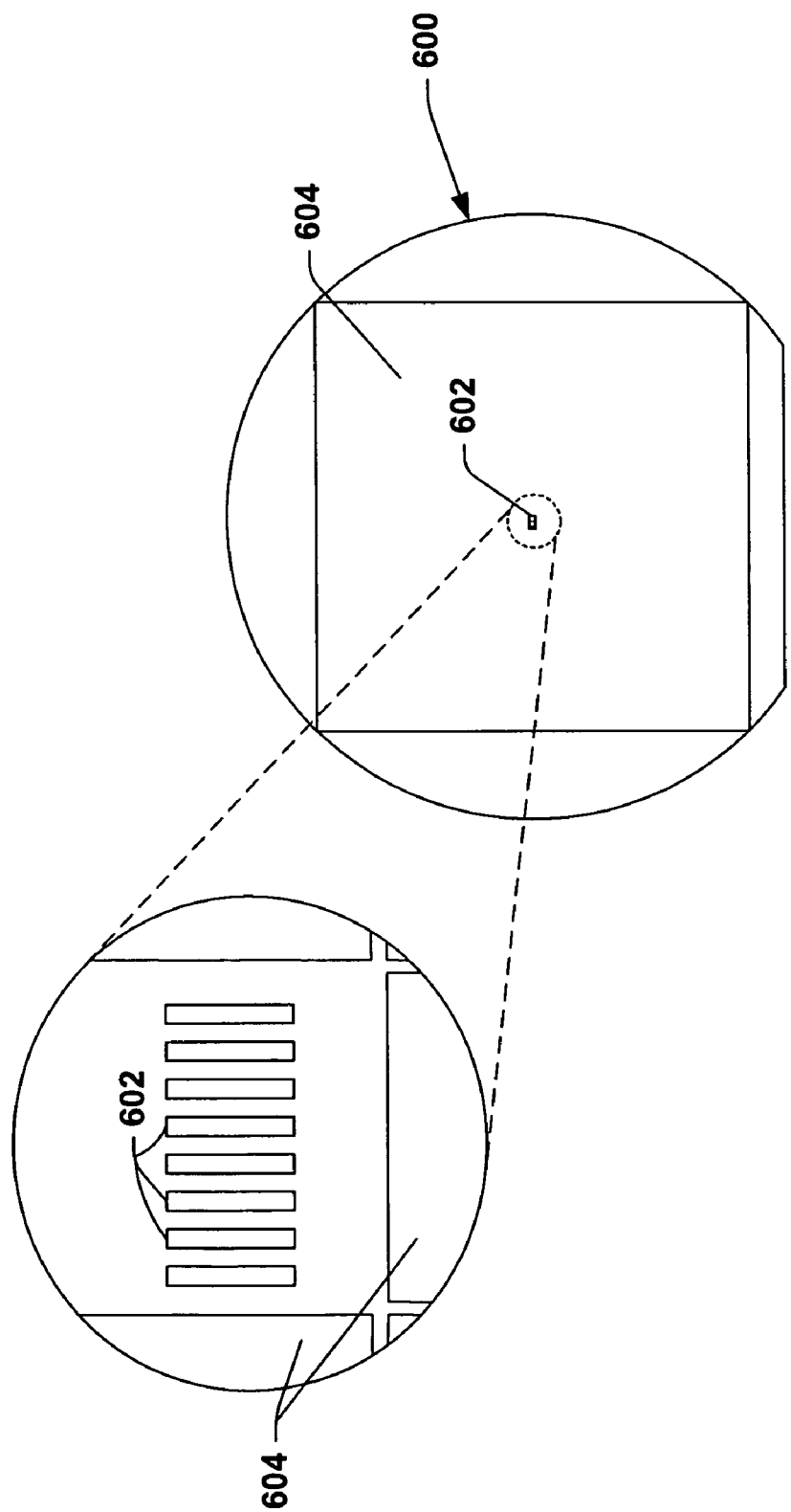
FIG. 6 is an illustration of a substrate in accordance with an aspect of the present invention.

Referring to FIG. 6, an example of a substrate 600 (e.g., wafer, wafer stage) such as can be utilized in connection with immersion lithography is illustrated for use in accordance with an aspect of the present invention. Gratings 602 are located near a central region of the substrate 600 to facilitate inspection and/or measurement of an immersion medium. The gratings 602 can be located between production regions of the substrate 604 so as to maximize real estate associated with the substrate 600 being manufactured. Alternatively, the gratings 602 can be located upon a wafer stage and/or a wafer not subject to production. The particular grating 602 illustrated in FIG. 6 is a series of elongated parallel marks, which can be implemented as raised portions in the substrate or as troughs, such as etched into the substrate 600. It is to be appreciated that more complex (e.g., nonlinear) grating patterns and/or substrate features (e.g., lines, connectors, . . . ) also could be used in accordance with an aspect of the present invention. A known grating structure can be employed in connection with the present invention and thus can facilitate deriving characteristics of an immersion medium by utilizing measurement techniques associated with the combination of substrate 600 and immersion medium.

Figure 7:
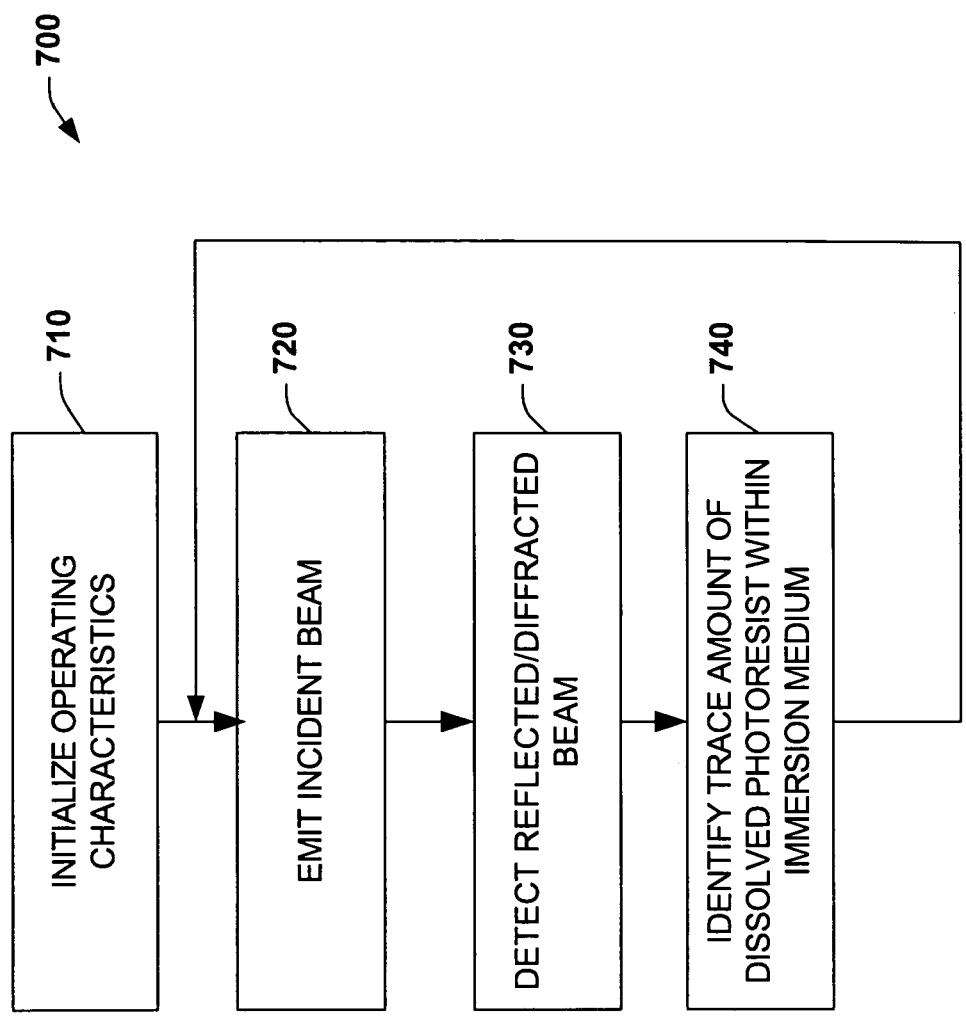
FIG. 7 is a flow diagram of a real time immersion medium characteristic monitoring and/or measuring methodology in accordance with an aspect of the present invention.
Figure 8:
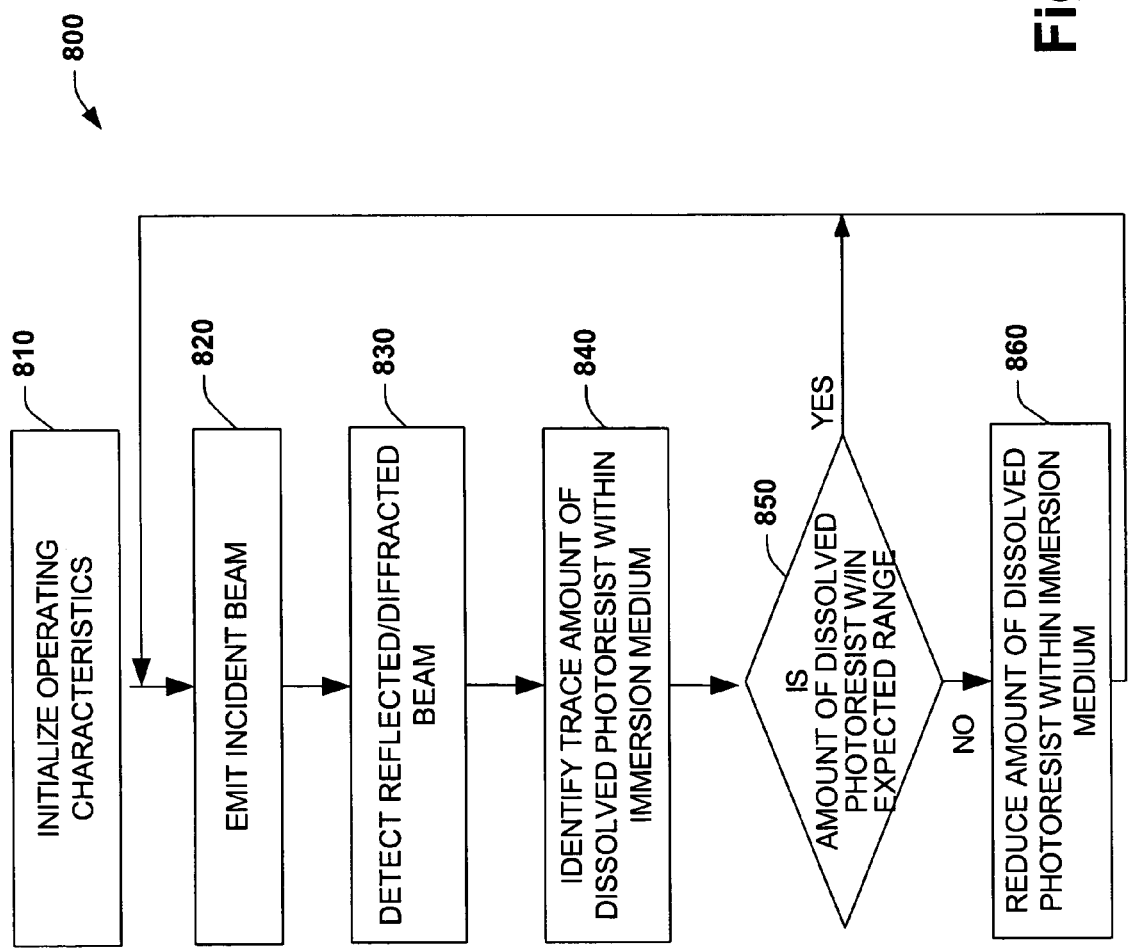
FIG. 8 is a flow diagram of a real time immersion medium characteristic monitoring and/or measuring methodology in accordance with an aspect of the present invention.

In view of the exemplary systems shown and described above, methodologies 700 and 800, which may be implemented in accordance with the present invention, will be better appreciated with reference to the flow diagrams of FIG. 7 and FIG. 8. While, for purposes of simplicity of explanation, the methodologies 700 and 800 are shown and described as a series of function blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement the methodologies 700 and 800 in accordance with the present invention. It is to be appreciated that the various blocks may be implemented via software, hardware a combination thereof or any suitable means (e.g., device, system, process, component) for carrying out the functionality associated with the blocks. It is also to be appreciated that the blocks are merely to illustrate certain aspects of the present invention in a simplified form and that these aspects may be illustrated via a lesser and/or greater number of blocks.

Turning to FIG. 7, the methodology 700 initializes operating characteristics to their starting values at 710. This can include, for example, placing a substrate with a known grating structure at least partially into the immersion medium and/or setting initial optical parameters of an incident beam for measuring topographical characteristics of the substrate in accordance with an aspect of the present invention.

At 720, an incident beam is emitted. The incident beam, for example, is emitted so as to interrogate a known grating structure upon a substrate and/or the immersion medium and/or a prism or mirror positioned upon the substrate. The known grating structure can be, for example, substantially parallel lines built upon a substrate. At 730, a diffracted and/or reflected beam produced from the incident beam interacting with the substrate, immersion medium, impurities dissolved within the immersion medium, prism, and/or mirror is detected. The reflected and/or diffracted beam, for example, is collected by a spectrometer or other optical detection device capable of detecting properties of the reflected and/or diffracted beam. The reflected and/or diffracted beam contains useful, quantifiable information indicative of amount of impurities (e.g., dissolved photoresist) and optical characteristics (e.g., refractive index (n), photolithographic constant (k)) of the substrate and immersion medium.

At 740, trace amounts of dissolved impurities such as, for example, photoresist from the substrate surface, within the immersion medium are identified. The amount of dissolved photoresist can be determined by employing known grating structures built upon a substrate. The known grating structure can be utilized with scatterometry to monitor the impurity level of the immersion medium.

From 740, the process returns to 720 where the foregoing acts can be repeated, such as for a time while the substrate with the known grating structure is within the immersion medium. The determined amount of impurities within the immersion medium can, in turn, be utilized to flush the immersion medium, purify the immersion medium, stop a semiconductor fabrication process, notify a user, adjust temperature, pressure, etc. of the immersion medium, thus reducing and/or eliminating the dissolved impurities from the immersion medium.

FIG. 8 is a flow diagram illustrating another methodology 800 for carrying out the present invention. At 810 the operating characteristics are initialized to their starting values. This can include, for example, placing a substrate with a known grating structure at least partially into the immersion medium and/or setting initial optical parameters of an incident beam for measuring topographical characteristics of the substrate in accordance with an aspect of the present invention.

At 820, an incident beam is emitted. The incident beam, for example, is emitted as to interrogate an immersion medium and/or a substrate (e.g., wafer, wafer stage, . . . ). A known grating structure can be built upon the substrate. Additionally, a prism or mirror can be utilized in connection with the present invention. The incident beam is reflected and/or diffracted to produce a beam having characteristics indicative of substrate and/or immersion medium properties illuminated by the incident beam. The produced beam further has characteristics indicative of an amount of impurities dissolved within the immersion medium (e.g., dissolved photoresist).

At 830, the reflected and/or diffracted beam is detected, such as using a spectrometer, although other optical detection techniques capable of detecting the reflected and/or diffracted beam could be used. At 840, optical characteristics of the reflected and/or diffracted beam, such as intensity of one or more wavelengths of the detected light, phase characteristics, refractive indices, polarization state, etc., are determined. The optical characteristics can be employed to derive an indication of an amount of dissolved photoresist within the immersion medium. Additionally, the optical characteristics can be utilized to measure immersion medium parameters, such as refractive index and lithographic constant.

At 850, a determination is made as to whether the amount of dissolved photoresist is within an expected range (e.g., below a threshold value). If the amount of dissolved photoresist is within the expected range, the process returns to 820 and the foregoing methodology is repeated. If the determination 850 is negative, indicating that the amount of impurities dissolved within the immersion medium is above a threshold amount, the process proceeds to 860. At 860, the amount of impurities (e.g., photoresist) dissolved within the immersion medium is reduced. The amount of impurities can be reduced, for example, by flushing the immersion medium, purifying the immersion medium, stopping the semiconductor fabrication process and/or notifying a user of the impurity level thereby facilitating the ability of the user to reduce the amount of impurities, etc.

From 860, the present iteration ends and the process returns to 820, in which the methodology continues, as described above such as for a duration commensurate with the associated fabrication process. As a result, the present invention facilitates controlling the amount of impurities dissolved in the immersion medium, thereby increasing the efficiency of immersion lithography systems.

Turning now to FIGS. 9–11, in accordance with one or more aspects of the present invention, a wafer 902 situated on a stage 904 can be logically partitioned into grid blocks. Each grid block (XY) of the grid pattern corresponds to a particular portion of the wafer 902, and each grid block has a known grating structure associated with that grid block. Each portion is monitored individually for signatures generated by the known grating structure and a portion of an immersion medium.

In FIG. 10, one or more portions of the immersion medium and the known grating structures in respective portions of the wafer 902 ($X_1Y_1 \ldots X_{12}, Y_{12}$) are being monitored for signatures using reflective and/or passed through light, a signature system and a processor. It is to be appreciated that although FIG. 10 illustrates the wafer 902 being mapped (partitioned) into 144 grid block portions, the wafer 902 may be mapped with any suitable number of portions and any suitable number of gratings may be employed. Given the set of recorded signatures, a processor can determine that an undesirable immersion medium characteristic (e.g., amount of dissolved impurities, refractive index, lithographic constant) exists. Similarly, a processor may generate feed forward information which can facilitate maintaining, terminating, and/or adjusting conditions associated with the immersion medium such as, for example, flushing the immersion medium, purifying the immersion medium, stopping a semiconductor process, notifying a user, varying temperature and/or pressure, etc.

FIG. 11 illustrates a table of expected and unexpected signatures. It can be seen that all the signatures are expected except a signature for grid $X_7Y_6$. The set of depicted signatures can be analyzed collectively as a master signature and/or can be analyzed in subsets to evaluate, for example, an amount of dissolved impurities (e.g., photoresist). The analysis of the signatures can be employed to control the amount of photoresist material dissolved in the immersion medium. Furthermore, temperature, pressure, etc. can be monitored and/or controlled in connection with the grid blocks which can impact optical characteristics of the immersion medium such as, for example, refractive index (n) and photolithographic constant (k).

Scatterometry is a technique for extracting information about a surface upon which an incident light has been directed. Information concerning properties including, but not limited to, dishing, erosion, profile, chemical composition, thickness of thin films and critical dimensions of features present on a surface such as a wafer can be extracted. Furthermore, information about an immersion medium such as refractive index and lithographic constant can be extracted by utilizing scatterometry techniques. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed and the immersion medium which the light travels through. Such properties include, but are not limited to, the chemical properties of the surface, the planarity of the surface, features on the surface, voids in the surface, and the number, type of layers beneath the surface, refractive index of the immersion medium, lithographic constant of the medium, the amount of impurities within the immersion medium.

Different combinations of the above-mentioned properties will have different effects on the phase and/or intensity of the incident light resulting in substantially unique intensity/phase signatures in the complex reflected and/or diffracted light. Thus, by examining a signal (signature) library of intensity/phase signatures, a determination can be made concerning the properties of the immersion medium utilized in connection with a known grating structure on the surface. Such substantially unique phase/intensity signatures are produced by light reflected from and/or refracted by different surfaces and/or immersion medium and/or impurities in the immersion medium due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N=n-jk$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a wafer or of an immersion medium can generate a first phase/intensity signature. Similarly, when exposed to the first incident light of known intensity, wavelength and phase, a second feature on a wafer or of an immersion medium can generate a second phase/intensity signature. For example, a line of a first width may generate a first signature while a line of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from scatterometry detecting components, the phase/intensity signals can be pattern matched, for example, to the library of signals to determine whether the signals correspond to a stored signature.

Figure 12:
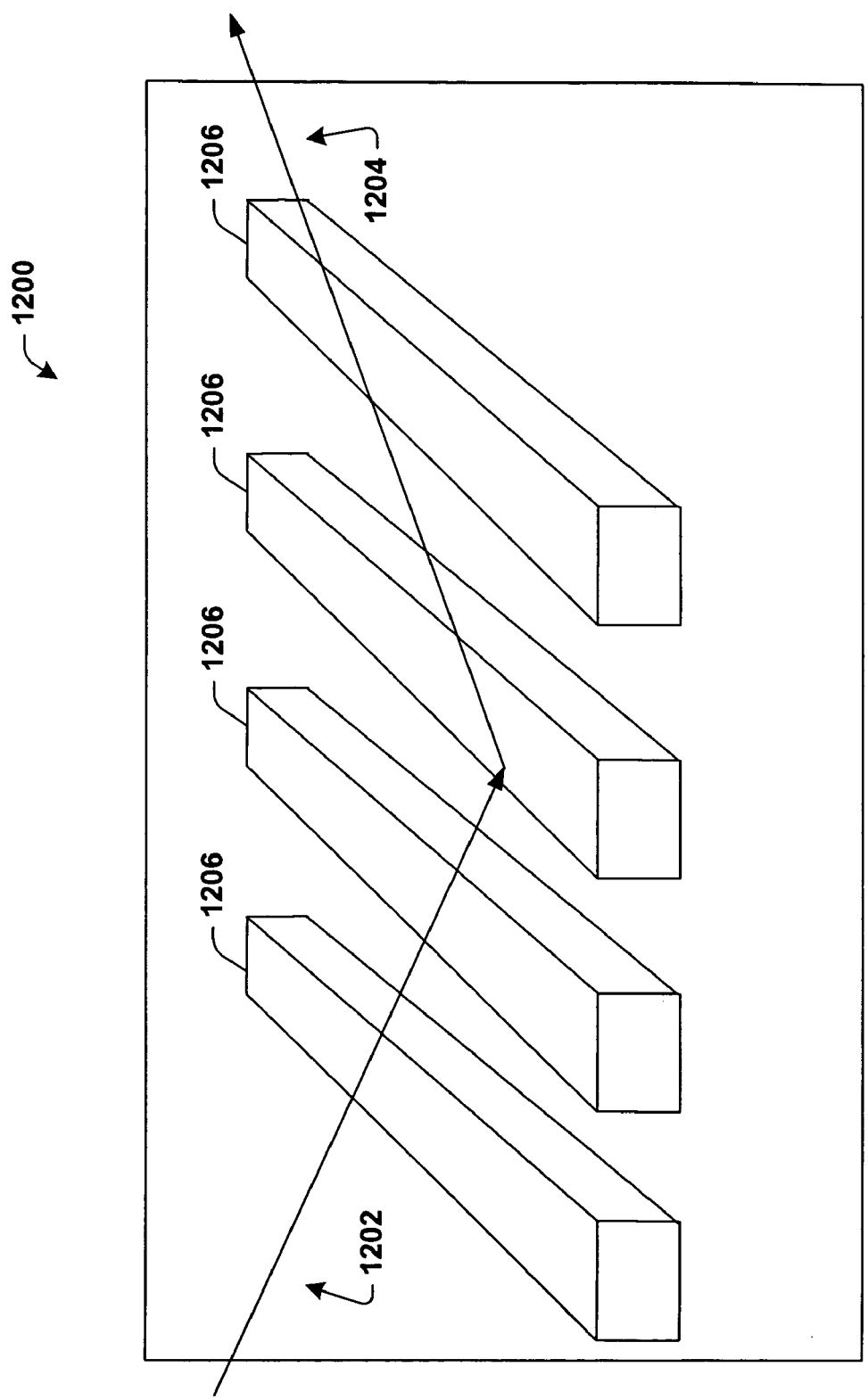
FIG. 12 is a simplified perspective view of an incident light reflecting off a surface in accordance with one or more aspects of the present invention.
Figure 17:
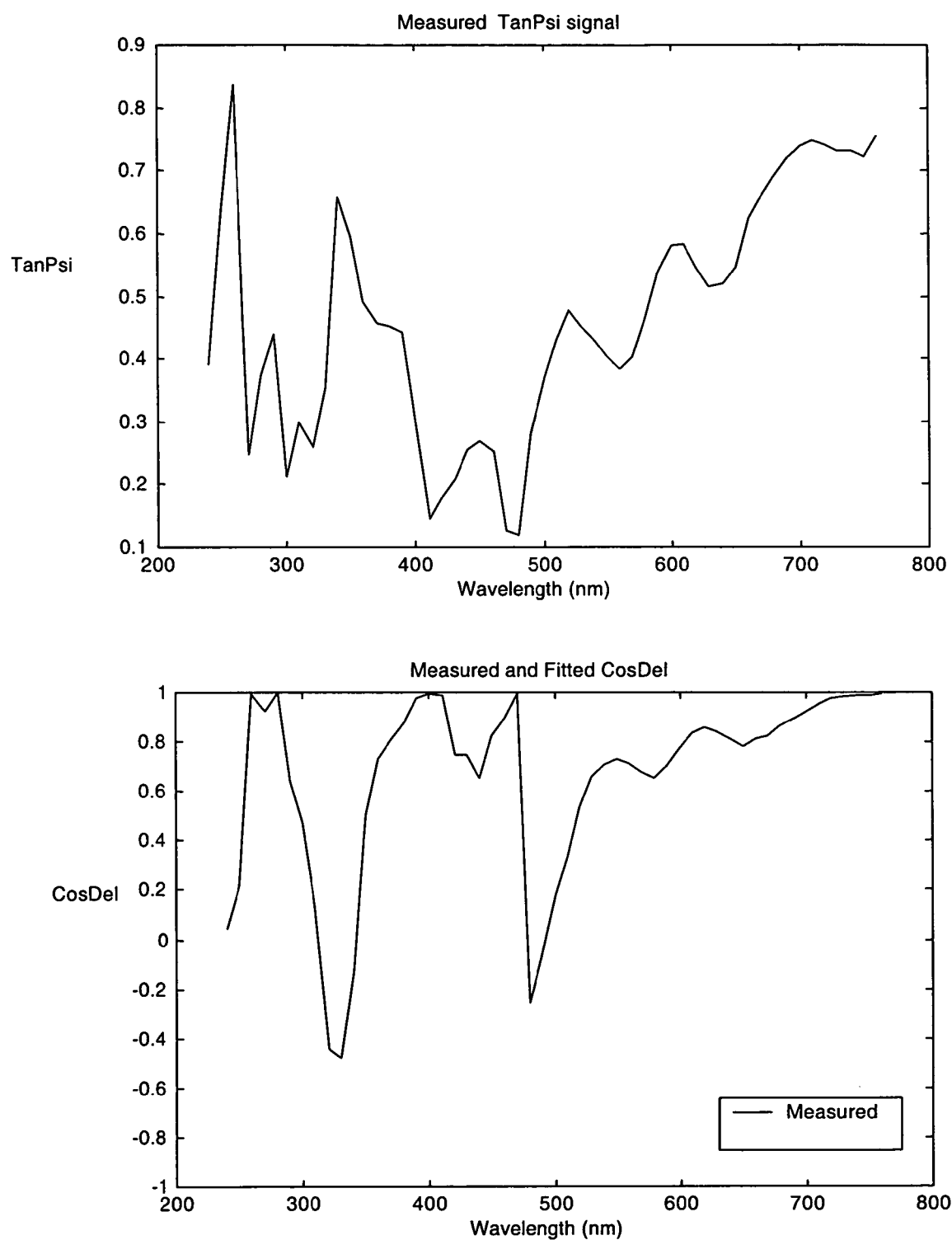
FIG. 17 is an illustration of phase and/or intensity signals recorded from a complex reflected and refracted light produced when an incident light is directed onto a surface in accordance with one or more aspects of the present invention.

To illustrate the principles described above, reference is now made to FIGS. 12 through 17. Referring initially to FIG. 12, an incident light 1202 is directed at a surface 1200, upon which one or more features 1206 may exist. In FIG. 12 the incident light 1202 is reflected as reflected light 1204. The incident light 1202 and/or reflected light 1204 can propagate through an immersion medium (not shown). The properties of the surface 1200, including but not limited to, thickness, uniformity, planarity, chemical composition and the presence of features, can affect the reflected light 1204. Furthermore, properties of the immersion medium can include, for example, impurity concentration, refractive index and lithographic constant. In FIG. 12, the features 1206 are raised upon the surface 1200. The phase and intensity of the reflected light 1204 can be measured and plotted, as shown, for example, in FIG. 17. The phase of the reflected light 1204 can be plotted, as can the intensity of the reflected light 1204. Such plots can be employed in connection with known grating structures built upon the surface to compare measured signals with signatures stored in a signature library using techniques like pattern matching, for example.

Figure 13:
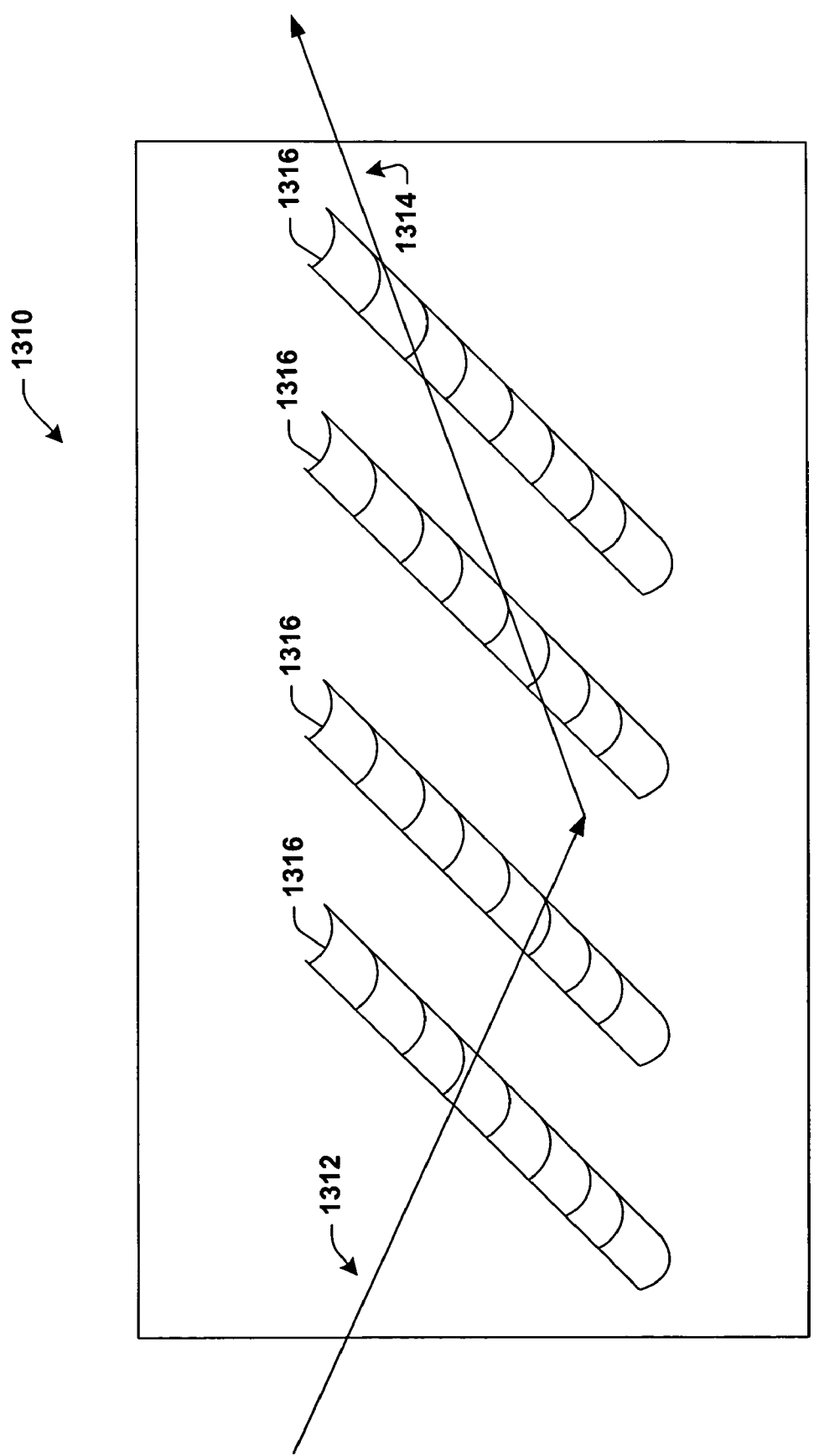
FIG. 13 is a simplified perspective view of an incident light reflecting off a surface in accordance with one or more aspects of the present invention.

Referring now to FIG. 13, an incident light 1312 is directed onto a surface 1310 upon which one or more depressions 1316 appear. The incident light 1312 is reflected as reflected light 1314. The incident light 1312 and/or reflected light 1314 can propagate through an immersion medium (not shown) and interact with dissolved impurities (e.g., photoresist from resist material surface). Like the one or more features 1206 (FIG. 12) may affect an incident beam, so too may the one or more depressions 1316 affect an incident beam. Thus, it is to be appreciated that scatterometry can be employed to measure features appearing on a surface, features appearing in a surface, and properties of a surface itself, regardless of features. Additionally, scatterometry can be utilized to measure features of the immersion medium such as an amount of dissolved impurities, which can be derived by employing a surface with a known grating structure.

Figure 14:
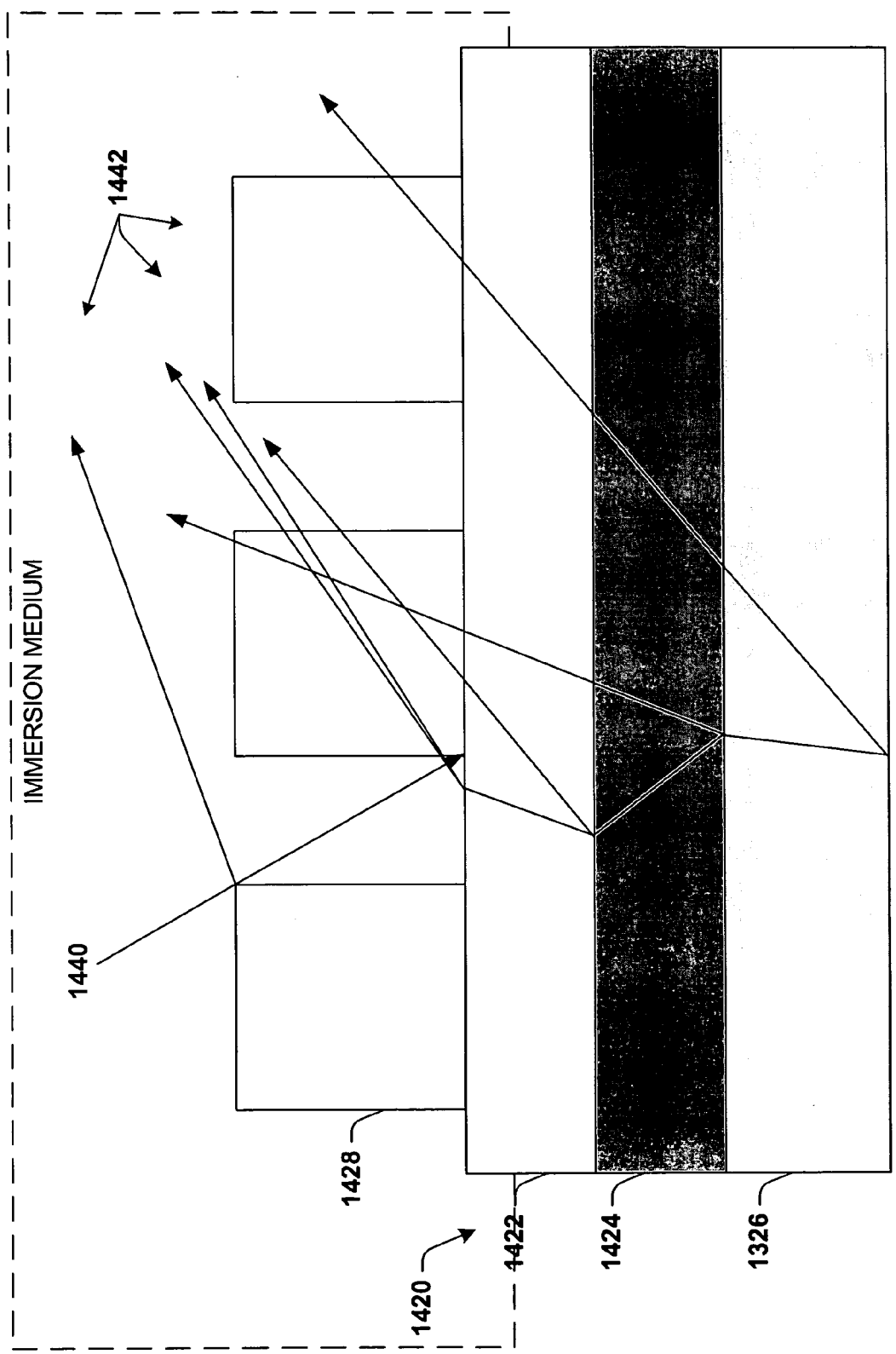
FIG. 14 is an illustration of a complex reflected and refracted light produced when an incident light is directed onto a surface in accordance with one or more aspects of the present invention.

Turning now to FIG. 14, complex reflections and refractions of an incident light 1440 are illustrated. The reflection and refraction of the incident light 1440 can be affected by factors including, but not limited to, the presence of one or more features 1428, the composition of the substrate 1420 upon which the features 1428 reside and characteristics of an immersion medium. For example, properties of the substrate 1420 including, but not limited to the thickness of a layer 1422, the chemical composition of the layer 1422, the opacity and/or reflectivity of the layer 1422, the thickness of a layer 1424, the chemical composition of the layer 1424, the opacity and/or reflectivity of the layer 1424, the thickness of a layer 1426, the chemical composition of the layer 1426, and the opacity and/or reflectivity of the layer 1426 can affect the reflection and/or refraction of the incident light 1440. Additionally, properties of the immersion medium can include, for example, refractive index, lithographic constant, etc. Thus, a complex reflected and/or refracted light 1442 may result from the incident light 1440 interacting with the features 1428, and/or the layers 1422, 1424 and 1426. Although three layers 1422, 1424 and 1426 are illustrated, it is to be appreciated that a substrate can be formed of a greater or lesser number of such layers. According to one aspect of the present invention, a substrate with a known grating structure build upon it is utilized, which facilitates deriving characteristics of the immersion medium (e.g., amount of dissolved impurities, refractive index, lithographic constant) by detecting scattered light.

Figure 15:
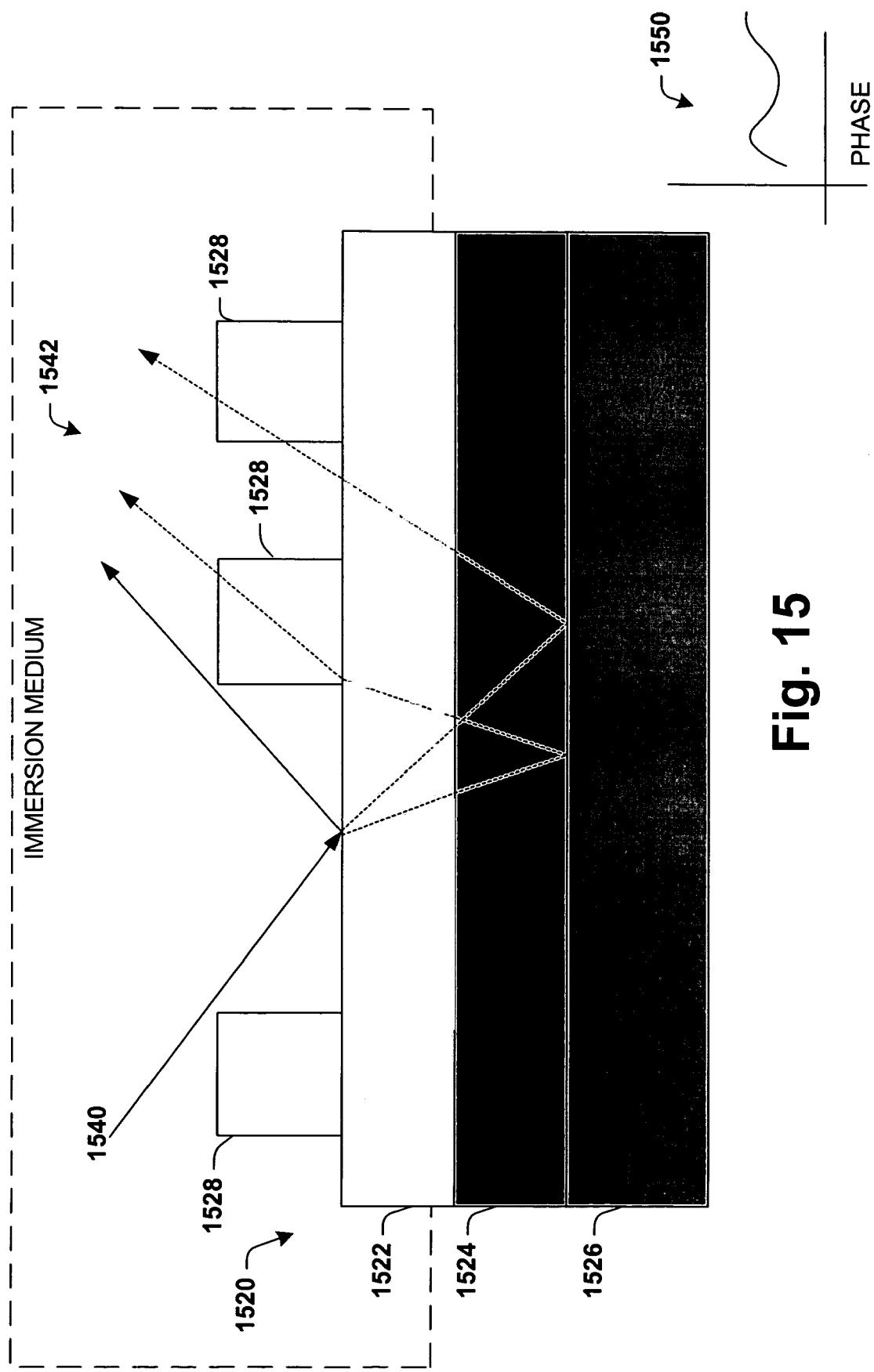
FIG. 15 is an illustration of a complex reflected and refracted light produced when an incident light is directed onto a surface in accordance with one or more aspects of the present invention.
Figure 16:
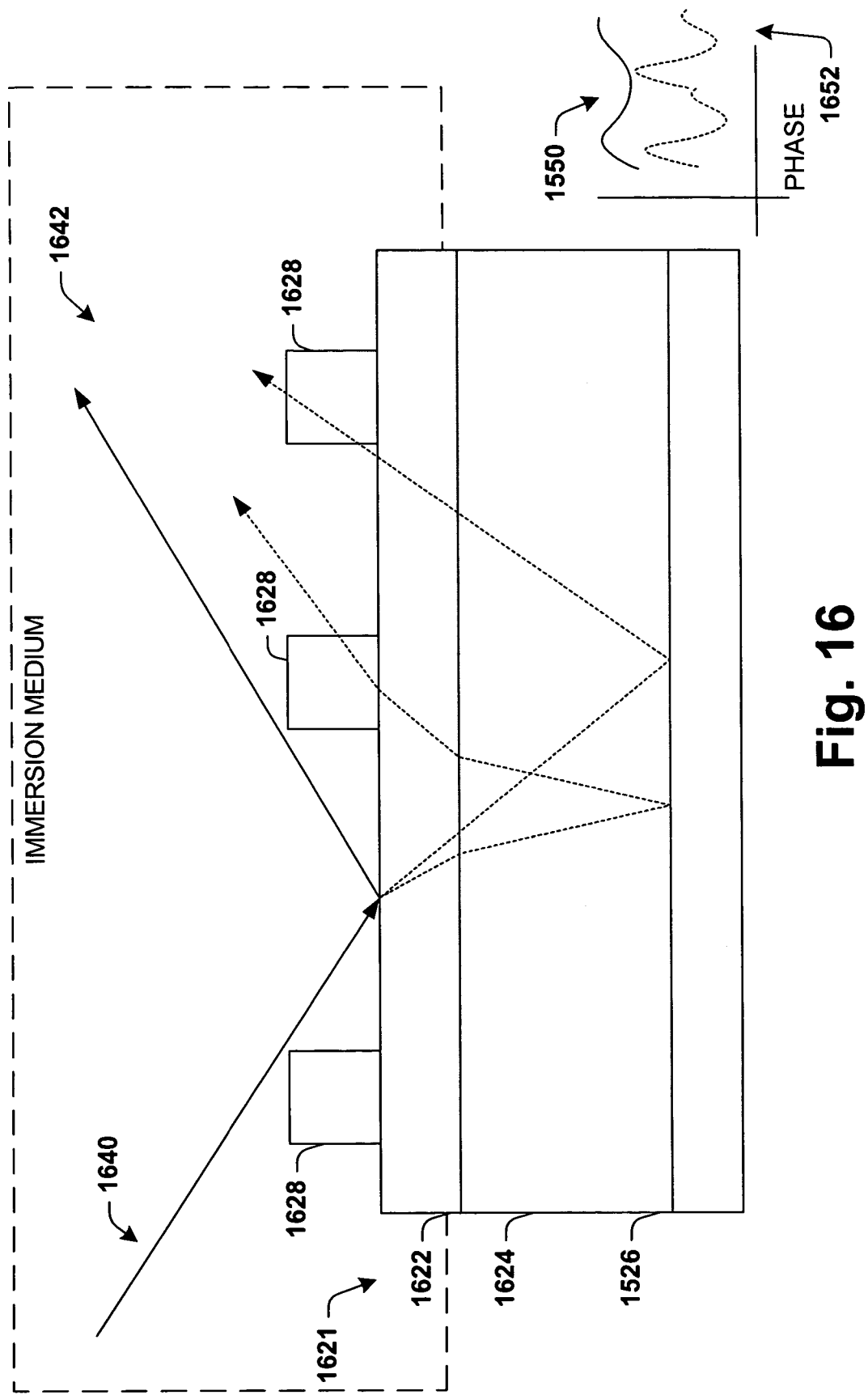
FIG. 16 is an illustration of a complex reflected and refracted light produced when an incident light is directed onto a surface in accordance with one or more aspects of the present invention.

Turning now to FIG. 15, one of the properties from FIG. 14 is illustrated in greater detail. The substrate 1520 can be formed of one or more layers 1522, 1524 and 1526. The phase 1550 of the reflected and/or refracted light 1542 can depend, at least in part, on the thickness of a layer, for example, the layer 1524. Thus, in FIG. 16, the phase 1650 of a reflected light 1642 differs from the phase 1550 due, at least in part, to the different thickness of the layer 1624 in FIG. 18 from the thickness of the layer 1524 in FIG. 15.

Thus, scatterometry is a technique that can be employed to extract information about a surface and/or immersion medium upon which an incident light has been directed. The information can be extracted by analyzing phase and/or intensity signals of a complex reflected and/or diffracted light. The intensity and/or the phase of the reflected and/or diffracted light will change based on properties of the surface and/or immersion medium upon which the light is directed, resulting in substantially unique signatures that can be analyzed to determine one or more properties of the surface and/or immersion medium upon which the incident light was directed.

Figure 18:
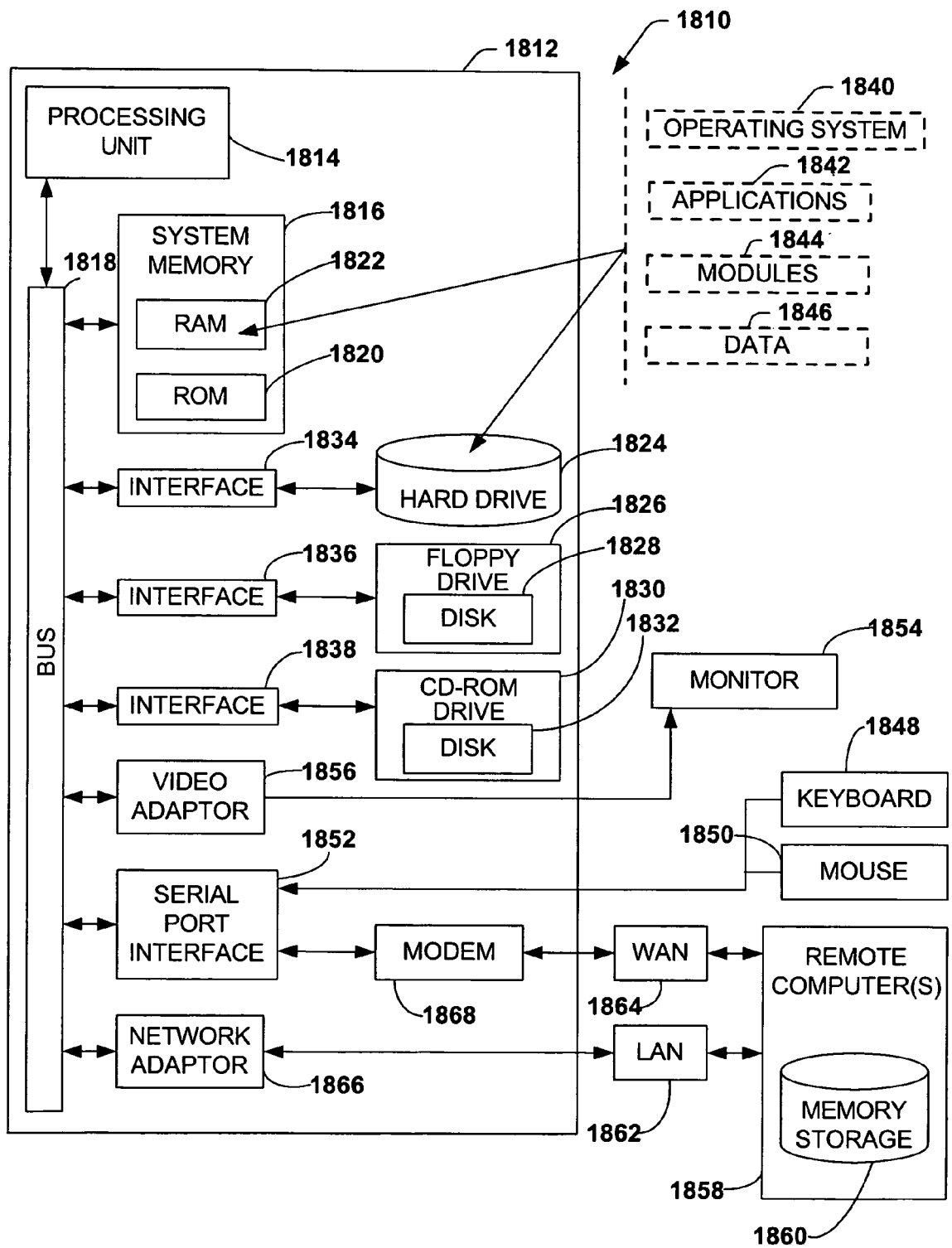
FIG. 18 is an illustration of an exemplary computing system and/or environment in connection with facilitating employment of the subject invention.

In order to provide additional context for various aspects of the present invention, FIG. 18 and the following discussion are intended to provide a brief, general description of a suitable computing environment 1810 in which the various aspects of the present invention can be implemented. While the invention has been described above in the general context of computer-executable instructions that may run on one or more computers, those skilled in the art will recognize that the invention also may be implemented in combination with other program modules and/or as a combination of hardware and software. Generally, program modules include routines, programs, components, data structures, etc. that perform particular tasks or implement particular abstract data types. Moreover, those skilled in the art will appreciate that the inventive methods may be practiced with other computer system configurations, including single-processor or multiprocessor computer systems, minicomputers, mainframe computers, as well as personal computers, hand-held computing devices, microprocessor-based or programmable consumer electronics, and the like, each of which may be operatively coupled to one or more associated devices. The illustrated aspects of the invention may also be practiced in distributed computing environments where certain tasks are performed by remote processing devices that are linked through a communications network. In a distributed computing environment, program modules may be located in both local and remote memory storage devices.

With reference to FIG. 18, an exemplary environment 1810 for implementing various aspects of the invention includes a computer 1812, including a processing unit 1814, a system memory 1816, and a system bus 1818 that couples various system components including the system memory to the processing unit 1814. The processing unit 1814 may be any of various commercially available processors. Dual microprocessors and other multi-processor architectures also can be used as the processing unit 1814.

The system bus 1818 can be any of several types of bus structure including a memory bus or memory controller, a peripheral bus, and a local bus using any of a variety of conventional bus architectures such as PCI, VESA, Microchannel, ISA, and EISA, to name a few. The system memory 1816 includes read only memory (ROM) 1820 and random access memory (RAM) 1822. A basic input/output system (BIOS), containing the basic routines that help to transfer information between elements within the computer 1812, such as during start-up, is stored in ROM 1820.

The computer 1812 further includes a hard disk drive 1824, a magnetic disk drive 1826 to read from or write to, for example, a removable disk 1828, and an optical disk drive 1830 for reading, for example, from a CD-ROM disk 1832 or to read from or write to other optical media. The hard disk drive 1824, magnetic disk drive 1826, and optical disk drive 1830 are connected to the system bus 1818 by a hard disk drive interface 1834, a magnetic disk drive interface 1836, and an optical drive interface 1838, respectively. The drives and their associated computer-readable media provide nonvolatile storage of data, data structures, computer-executable instructions, etc. for the computer 1812, including for the storage of broadcast programming in a suitable digital format. Although the description of computer-readable media above refers to a hard disk, a removable magnetic disk and a CD, it should be appreciated by those skilled in the art that other types of media which are readable by a computer, such as magnetic cassettes, flash memory cards, digital video disks, Bernoulli cartridges, and the like, may also be used in the exemplary operating environment, and further that any such media may contain computer-executable instructions for performing the methods of the present invention.

A number of program modules may be stored in the drives and RAM 1822, including an operating system 1840, one or more application programs 1842, other program modules 1844, and program data 1846. The operating system 1840 in the illustrated computer is, for example, the "Microsoft® Windows® NT" operating system, although it is to be appreciated that the present invention may be implemented with other operating systems or combinations of operating systems, such as UNIX®, LINUX®, etc.

A user may enter commands and information into the computer 1812 through a keyboard 1848 and a pointing device, such as a mouse 1850. Other input devices (not shown) may include a microphone, an IR remote control, a joystick, a game pad, a satellite dish, a scanner, or the like. These and other input devices are often connected to the processing unit 1814 through a serial port interface 1852 that is coupled to the system bus 1818, but may be connected by other interfaces, such as a parallel port, a game port, a universal serial bus ("USB"), an IR interface, etc. A monitor 1854 or other type of display device is also connected to the system bus 1818 via an interface, such as a video adapter 1856. In addition to the monitor, a computer typically includes other peripheral output devices (not shown), such as speakers, printers etc.

The computer 1812 may operate in a networked environment using logical connections to one or more remote computers, such as a remote computer(s) 1858. The remote computer(s) 1858 may be a workstation, a server computer, a router, a personal computer, microprocessor based entertainment appliance (e.g., a WEBTV® client system), a peer device or other common network node, and typically includes many or all of the elements described relative to the computer 1812, although, for purposes of brevity, only a memory storage device 1860 is illustrated. The logical connections depicted include a local area network (LAN) 1862 and a wide area network (WAN) 1864. Such networking environments are commonplace in offices, enterprise-wide computer networks, intranets and the Internet.

When used in a LAN networking environment, the computer 1812 is connected to the local network 1862 through a network interface or adapter 1866. When used in a WAN networking environment, the computer 1812 typically includes a modem 1868, or is connected to a communications server on the LAN, or has other means for establishing communications over the WAN 1864, such as the Internet. The modem 1868, which may be internal or external, is connected to the system bus 1818 via the serial port interface 1852 to enable communications, for example, via POTS. The modem 1868 may also, in an alternative embodiment, be connected to the network adaptor 1866 to enable communications, for example, via DSL or cable. In a networked environment, program modules depicted relative to the computer 1812, or portions thereof, will be stored in the remote memory storage device 1860. It may be appreciated that the network connections shown are exemplary and other means of establishing a communications link between the computers may be used.

Described above are preferred aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

The invention claimed is:

1. A system that monitors characteristics of an immersion medium to facilitate controlling semiconductor manufacturing, comprising:
   a transmitting component that emits a first signal into the immersion medium;
   a receiving component that accepts a second signal from the immersion medium, the second signal is at least one of a reflected and a diffracted first signal;
   a monitoring component that analyzes the second signal to determine an amount of impurity in the immersion medium that reduces transparency of the immersion medium to an exposure wavelength, the amount of impurity is utilized to control the semiconductor manufacturing process; and
   a control component that mitigates the amount of impurity based on the determined amount of impurity.

2. The system of claim 1, the monitoring component determines the amount of impurity in real time.

3. The system of claim 1, the impurity is dissolved photoresist from a substrate surface.

4. The system of claim 1, the control component operates to vary the characteristics of the immersion medium in real time.

5. The system of claim 4, the control component flushes the immersion medium and provides a second immersion medium.

6. The system of claim 4, the control component stops the semiconductor manufacturing process when the amount of impurity exceeds a threshold.

7. The system of claim 4, the control component provides a notification to a user related to the amount of impurity.

8. The system of claim 4, the control component purifies the immersion medium when the amount of impurity exceeds a threshold.

9. The system of claim 1, the monitoring component employs a scatterometry technique.

10. The system of claim 1, the monitoring component determines an optical property of the immersion medium.

11. The system of claim 10, the optical property comprising at least one of a refractive index (n) and a lithographic constant (k).

12. The system of claim 1, further comprising a substrate upon which a known grating structure is built, wherein the substrate is subject to a semiconductor manufacturing process via the immersion medium.

13. The system of claim 1, the immersion medium is at least one of water, perfluorinated polyether, ozone vapor, and supercritical fluid in gaseous phase.

14. A system that monitors an immersion medium for an amount of impurity, comprising:
- means for measuring the amount of impurity within the immersion medium in real time that reduces transparency of the immersion medium to an exposure wavelength; and
- means for reducing the amount of transparency-reducing impurity within the immersion medium in real time based at least in part on the measured amount of impurity.

15. The system of claim 14, further comprising means for emitting an incident light beam through an immersion medium and onto a known grating structure upon a substrate.

16. The system of claim 15, further comprising means for detecting at least one of reflected and diffracted light related to the interaction of the incident light beam, the immersion medium and the known grating structure.

17. The system of claim 14, further comprising means for determining optical properties of the immersion medium, the optical properties comprising at least one of an index of refraction (n) and a lithographic constant (k).

18. A method for measuring and controlling characteristics of an immersion medium utilized with a semiconductor manufacturing process, comprising:
- transmitting a incident signal through an immersion medium and onto a substrate upon which a known grating structure is built;
- receiving at least one of a reflected signal and diffracted signal related to the incident signal interacting with the immersion medium and the known grating structure; and
- determining an amount of an impurity within the immersion medium in real time based on the at least one of the reflected signal and the diffracted signal.

19. The method of claim 18, further comprising identifying an optical property based the at least one of the reflected signal and the diffracted signal, the optical property is at least one of an index of refraction (n) and a lithographic constant (k).

20. The method of claim 18, further comprising inferring the amount of impurity within the immersion medium by utilizing artificial intelligence.

21. The method of claim 18, further comprising controlling the amount of the impurity within the immersion medium.

22. The method of claim 21, controlling the amount of the impurity comprises flushing the immersion medium.

23. The method of claim 21, controlling the amount of the impurity comprises stopping the semiconductor manufacturing process.

24. The method of claim 21, controlling the amount of the impurity comprises notifying a user.

25. The method of claim 21, controlling the amount of the impurity comprises purifying the immersion medium.

* * * * *